(12) United States Patent
Shimoda

(10) Patent No.: US 6,902,948 B2
(45) Date of Patent: Jun. 7, 2005

(54) METHOD OF PRODUCING PHOTOVOLTAIC ELEMENT

(75) Inventor: Hiroshi Shimoda, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/772,269

(22) Filed: Feb. 6, 2004

(65) Prior Publication Data
US 2004/0157351 A1 Aug. 12, 2004

(30) Foreign Application Priority Data
Feb. 6, 2003 (JP) ..................... 2003-029444

(51) Int. Cl.[7] .................................. H01L 21/00
(52) U.S. Cl. ........................... 438/97; 438/488
(58) Field of Search .................... 438/97, 98, 96, 438/61, 62, 69, 485, 488, 489

(56) References Cited

U.S. PATENT DOCUMENTS

| | | | |
|---|---|---|---|
| 4,166,918 A | 9/1979 | Nostrand et al. | 136/89 |
| 4,451,970 A | 6/1984 | Izu et al. | 29/574 |
| 5,320,723 A | 6/1994 | Kawakami | 204/140 |
| 5,897,332 A * | 4/1999 | Hori et al. | 438/61 |
| 6,025,039 A * | 2/2000 | Yajima | 427/573 |
| 6,221,685 B1 | 4/2001 | Ichinose et al. | 438/48 |
| 6,261,862 B1 | 7/2001 | Hori et al. | 438/96 |
| 6,331,670 B2 * | 12/2001 | Takehara et al. | 136/244 |

FOREIGN PATENT DOCUMENTS

| | | |
|---|---|---|
| JP | 2921802 | 7/1999 |
| JP | 11-233802 | 8/1999 |
| JP | 2000-49370 | 2/2000 |

\* cited by examiner

*Primary Examiner*—David Nhu
(74) *Attorney, Agent, or Firm*—Fitzpatrick, Cella, Harper and Scinto

(57) ABSTRACT

A method of producing a photovoltaic element is provided which comprises the steps of immersing in an electrolytic solution a photovoltaic element including a back surface reflecting layer, a semiconductor layer and a transparent electrode layer successively stacked on a substrate, applying a forward voltage to the photovoltaic element to effect an electrolytic treatment to reduce the transparent electrode layer in a short-circuit portion of the photovoltaic element, thereby selectively removing a short-circuit current path in the photovoltaic element due to a defect, wherein a voltage gradient when the forward voltage applied to the photovoltaic element is lowered to 0 V or a such forward voltage as to effect no reduction reaction of the transparent electrode layer is controlled to be −15 V/s to −0.1 V/s, whereby a shunt portion is selectively removed with reliability without increasing a shunt path.

10 Claims, 10 Drawing Sheets

FORWARD VOLTAGE FREE FROM REDUCTION REACTION OF TRANSPARENT ELECTRODE LAYER

FORWARD VOLTAGE FREE FROM REDUCTION REACTION OF TRANSPARENT ELECTRODE LAYER

FORWARD VOLTAGE FREE FROM REDUCTION REACTION OF TRANSPARENT ELECTRODE LAYER

FORWARD VOLTAGE FREE FROM REDUCTION REACTION OF TRANSPARENT ELECTRODE LAYER

METHOD OF PRODUCING PHOTOVOLTAIC ELEMENT

BACKGROUND OF THE INVENTION

1. Field of the Invention

The present invention relates to a method of producing a photovoltaic element, more particularly a thin-film solar cell, and also to the construction of a photovoltaic element having good characteristics and producible in a high yield, more particularly the construction of a solar cell.

2. Related Background Art

In recent years, the study and development of various techniques for commercialization of solar power generation using solar cells have been pursued. For establishment of a system using solar cells and capable satisfying demands for power, it is necessary that the solar cells have a sufficiently high photoelectric conversion efficiency and improved reliability and are capable of being mass-produced.

Amorphous silicon solar cells attract attention because they are producible at a lower cost and have high mass-producibility in comparison with solar cells made by using crystalline Si or the like. This is for the reason that a semiconductor film or the like can be formed as a deposited film on a comparatively inexpensive substrate in the form of a belt such as a metal sheet or a resin sheet by using a source gas such as silane gas easily obtainable and decomposing the gas by glow discharge.

On the other hand, the study and development of microcrystalline silicon solar cells having a limited lowering in photoelectric conversion efficiency (the so-called photodegradation) at the time of irradiation with light in comparison with amorphous silicon solar cells and capable of being formed at a considerably lower temperature in comparison with crystalline silicon solar cells such as polycrystalline silicon solar cells are being promoted.

In a case where solar cells are used for supply of electric power for ordinary home use, an output of about 3 kW is required. If the solar cells have a photoelectric conversion efficiency of 10%, the total area of the solar cells will be 30 $m^2$. In such a case, large-area solar cells are required. However, it is extremely difficult to make a solar cell without a defect through a large area for reasons relating to the producing process.

For example, in microcrystalline silicon having small grains randomly grown in a columnar shape, a low-resistance portion can be formed easily at the grain boundary and a shunt path can be formed easily through the grain boundary. Further, it is known that in a thin-film solar cell such as an amorphous silicon solar cell a pinhole or a defect may occur at the time of film formation of the semiconductor layer due to the influence of a dust or the like and act as a cause of a shunt which considerably lowers the photoelectric conversion efficiency and yield.

The cause of occurrence of a pinhole or a defect will be described in detail. For example, in the case of an amorphous silicon solar cell deposited on a stainless steel substrate, the substrate surface cannot be said to be a completely smooth surface; scratches or struck impressions exist in the surface, and a back surface reflecting layer having an unevenness structure is provided on the substrate for the purpose of effectively utilizing incident light. Therefore, it is difficult to completely cover this surface with a thin-film semiconductor layer such as an n-or p-layer having a thickness of about several ten nm.

In a case where a portion of a semiconductor layer existing between a first electrode (lower electrode) and a second electrode (upper electrode) is lost due to a pinhole or the like and the lower electrode and the upper electrode are in direct contact with each other, or in a case where the semiconductor layer is not completely lost at a portion but a low-resistance shunt exists at that portion, a current generated by light flows in the upper electrode parallel to the surface thereof and flows into the low-resistance shunt portion, thereby causing a current loss. If such a current loss occurs, the open circuit voltage of the solar cell is lowered. In amorphous silicon solar cells, the sheet resistance of the semiconductor layer itself is ordinarily high and, therefore, a transparent upper electrode covering the entire semiconductor surface is required. Ordinarily, a transparent electrode layer such as $SnO_2$, $In_2O_3$ or ITO ($In_2O_3+SnO_2$) film excellent in transparency to visible light and in electrical conductivity is provided. Therefore, the current flowing into a small defect will considerably be large. Further, in a case where the position of a defect is remote from a grid electrode provided on the transparent conductor layer, the resistance to the current flowing into the defective portion is large and, therefore, the current loss is comparatively small. On the contrary, in a case where a defective portion exists below the grid electrode, the current loss due to the defect will be larger.

On the other hand, at a pinhole-like defective portion, not only leakage through the defective portion of electric charge generated in the semiconductor layer occurs but also a phenomenon occurs in which an ionic substance is generated by the interaction with water if any, the electrical resistance of the defective portion will thereby be lower gradually with the passage of solar cell operating time, and degradation of the characteristics including the photoelectric conversion efficiency will result.

In a case where the above-described shunt occurs, the current loss can be reduced by directly removing the defective portion or the pinhole or removing the upper electrode about the shunt portion.

As a method of directly removing a defective portion, a method of burning off a defective portion of a solar cell by using a sufficiently high reverse bias not higher than the breakdown voltage is known (see, for example, U.S. Pat. No. 4,166,918).

As a method of selectively removing the upper electrode about a shunt portion, a method of removing the upper electrode about a shunt portion of a solar cell by etching in such a manner that the solar cell is immersed in an acid, salt or alkali electrolyte and a bias is applied between the solar cell and a counter electrode is known (see, for example, U.S. Pat. No. 4,451,970; Japanese Patent No. 2921802; Japanese Patent Application Laid-Open No. H11-233802; and Japanese Patent Application Laid-Open No. 2000-49370). Studies have already been made of conditions including the kind, concentration and specific conductivity of the electrolyte, the bias voltage range, the current density range in which the bias flows through the electrolyte or the solar cell when applied, the bias application time according to the film thickness of the transparent electrode layer, and application of a pulse voltage in a stepwise manner (in rectangular form).

However, the above-described method of burning off a defective portion has a problem that since a high reverse bias is applied to the solar cell, there is a possibility of damage to the normal portion other than the defective portion when the defective portion is burnt off, and it is difficult to control the process.

The method of applying the desired pulse voltage in a stepwise manner (in rectangular form) in an electrolyte is advantageously effective in selectively removing the upper electrode about a shunt portion but has a problem that when the applied voltage is abruptly reduced to a voltage at which etching reaction is not caused, e.g., 0 V, a large negative current (C·dV/dt where C is the electrical capacity between the solar cell and the counter electrode and dV/dt is a time differential of the applied voltage, hereinafter referred to as "voltage gradient") flows into the solar cell to break a weak portion of the solar cell other than the shunt portion, thereby increasing the shunt path.

SUMMARY OF THE INVENTION

In view of the above-described problems, an object of the present invention is to provide a method of producing a photovoltaic element, more particularly a thin-film solar cell having good characteristics and producible in a high yield, which method ensures that in a case where a shunt portion of the photovoltaic element in which a back surface reflecting layer, a semiconductor layer and a transparent electrode layer are successively stacked on a substrate is removed by an electrolytic treatment in such a manner that the photovoltaic element is immersed in an electrolytic solution and a forward voltage is applied to the photovoltaic element to cause a reduction reaction on the transparent electrode layer in the defective portion, the shunt portion can selectively be removed with reliability without causing breakdown of any portion other than the shunt portion and without increasing the shunt path.

To achieve the above-described object, according to the present invention, there is provided a method of producing a photovoltaic element comprising the steps of immersing in an electrolytic solution a photovoltaic element comprising a back surface reflecting layer, a semiconductor layer and a transparent electrode layer successively stacked on a substrate, applying a forward voltage to the photovoltaic element to effect an electrolytic treatment to reduce the transparent electrode layer in a short-circuit portion of the photovoltaic element, thereby selectively removing a short-circuit current path in the photovoltaic element due to a defect, wherein a voltage gradient when the forward voltage applied to the photovoltaic element is caused to drop to 0 V or a such forward voltage as to effect no reduction reaction of the transparent electrode layer is −15 V/s to −0.1 V/s.

According to the present invention, it is preferred that the forward voltage is not less than the open circuit voltage of the photovoltaic element.

It is also preferred that the applied voltage is in a form of a trapezoidal or sawtooth wave that alternates between the forward voltage not less than the open circuit voltage of the photovoltaic element and 0 V or a forward voltage at which the reduction reaction of the transparent electrode layer does not occur.

It is also preferred that the applied voltage is applied a plural number of times.

It is also preferred that the photovoltaic element is cleansed with water and dried after the electrolytic treatment.

It is also preferred that the electrical conductivity of the electrolytic solution is 20 to 100 mS/cm and the temperature of the electrolytic solution is within the temperature range of 20 to 80° C.

DESCRIPTION OF THE PREFERRED EMBODIMENTS

An embodiment of the present invention will be described below in detail.

Figure 1:
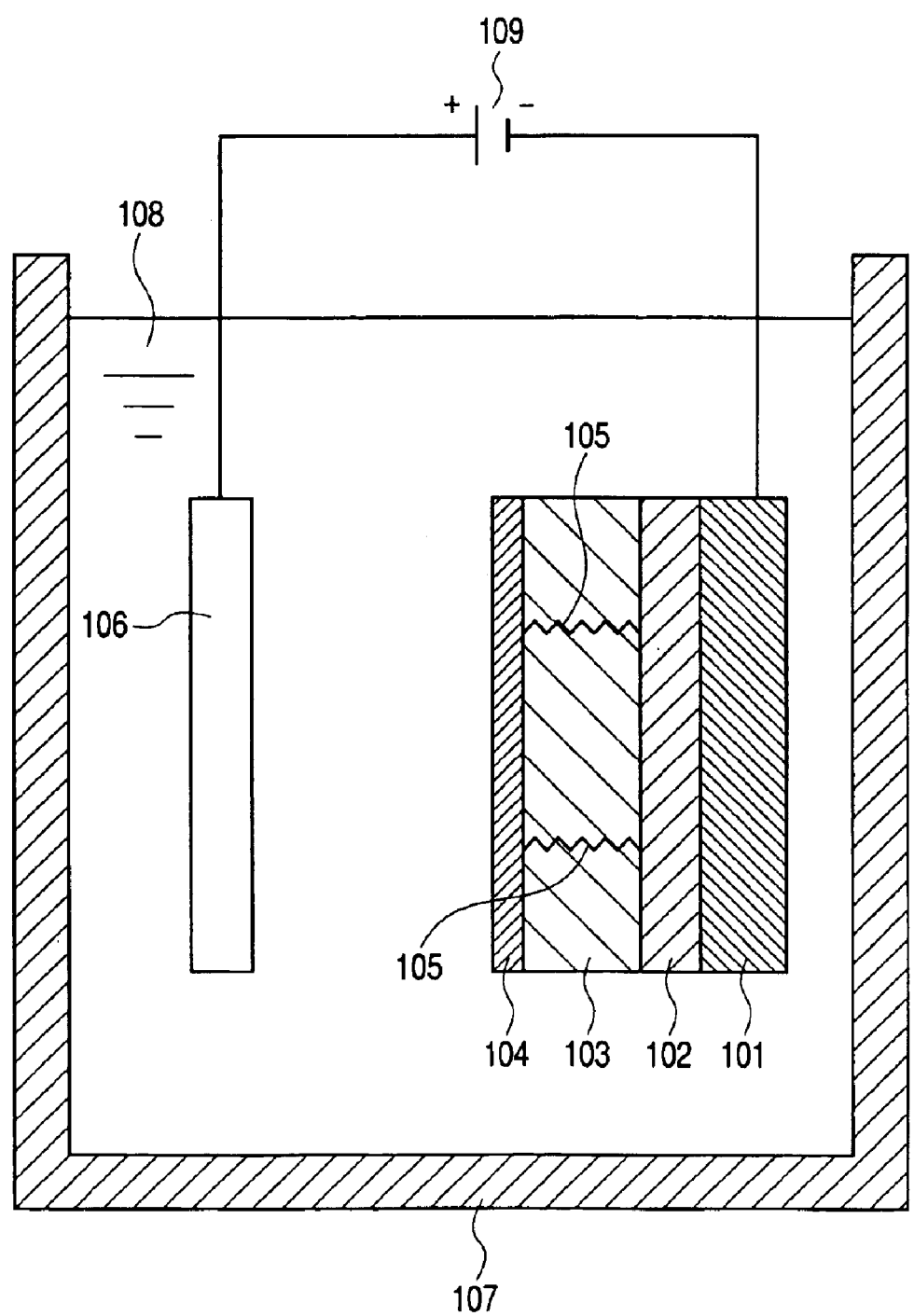
FIG. 1 is a view showing an example of an electrolytic treatment apparatus for implementation of the present invention.
Figure 2A:
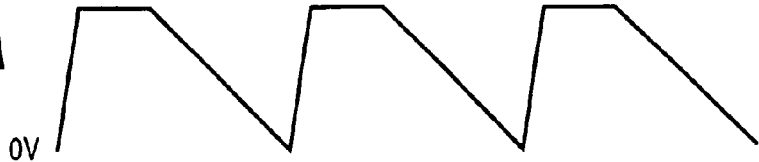
FIGS. 2A, 2B, 2C and 2D are views each showing an example of the waveform of an applied voltage in accordance with the present invention.
Figure 2B:
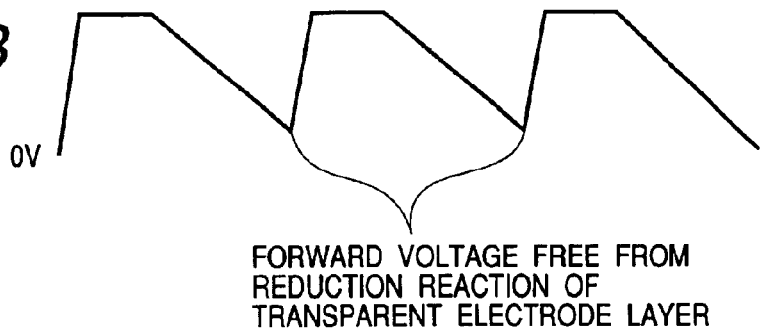
Figure 2C:
Figure 2D:
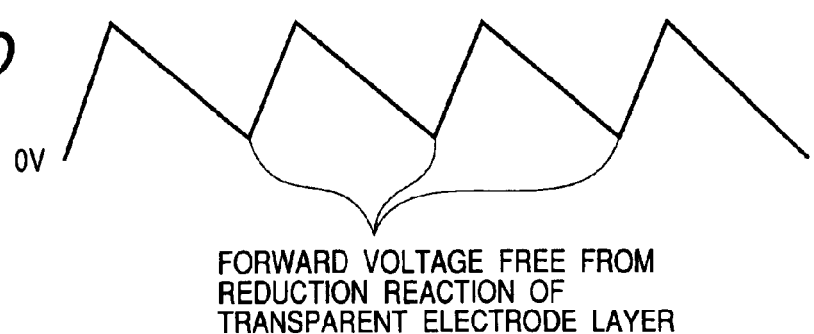

FIG. 1 is a view showing an example of an electrolytic treatment apparatus for implementation of the present invention. In FIG. 1, reference numeral 101 denotes an electroconductive substrate made of stainless steel or the like, 102 denotes a back surface reflecting layer, 103 denotes a semiconductor layer, 104 denotes a transparent electrode layer, 105 denotes a short-circuit current path, 106 denotes a counter electrode, 107 denotes an electrolytic treatment tank, 108 denotes an electrolytic solution, and 109 denotes a power supply for application of a voltage.

Figure 3:
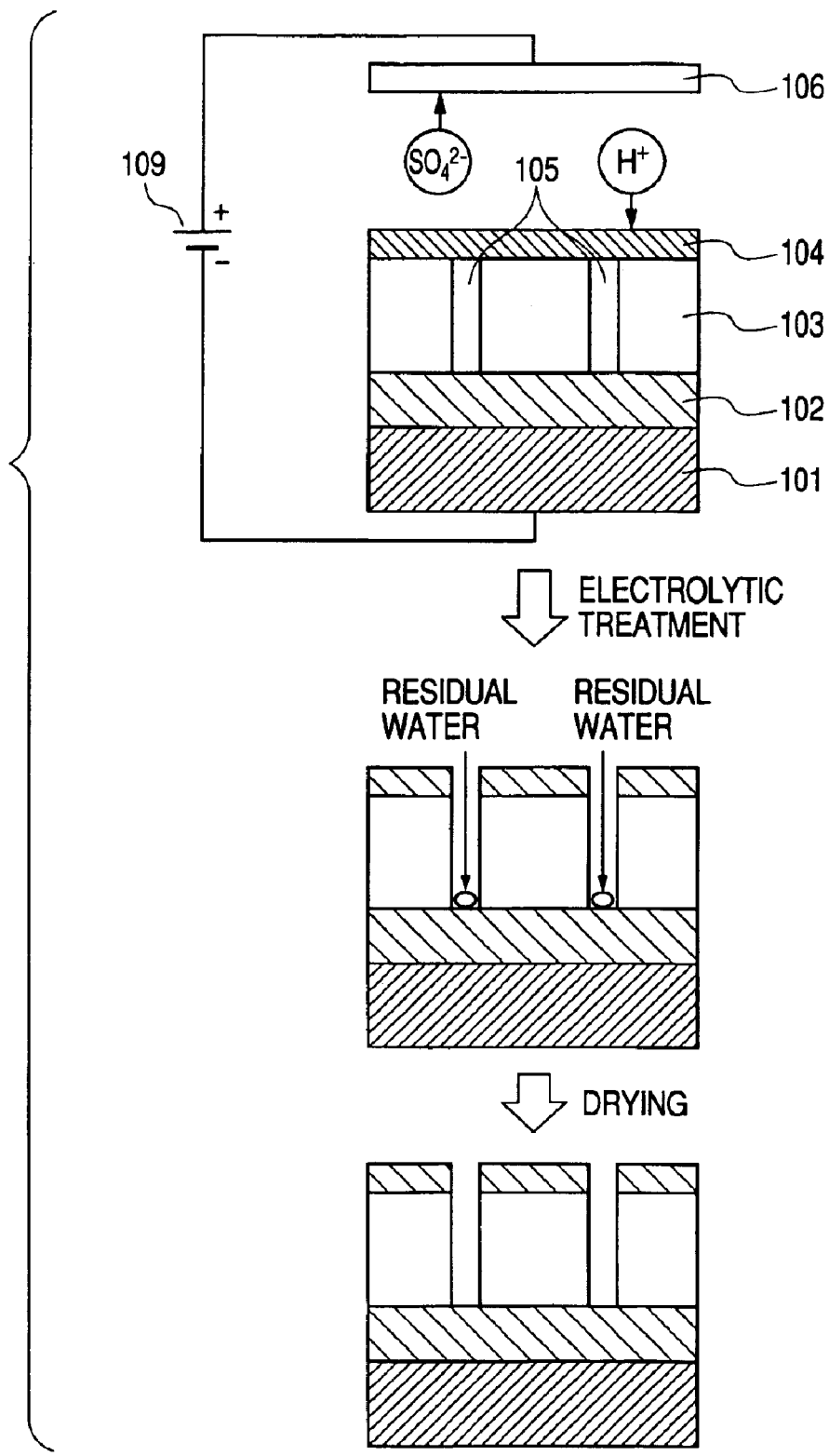
FIG. 3 is a view schematically showing an example of electrolytic treatment steps in accordance with the present invention.

According to the present invention, the photovoltaic element having the back surface reflecting layer 102, the semiconductor layer 103 and the transparent electrode layer 104 successively stacked on the substrate 101 is immersed in the electrolytic solution 108, and an electrolytic treatment is performed in such a manner that a voltage in a trapezoidal or sawtooth waveform alternating between a forward voltage not less than the open circuit voltage of the photovoltaic element and 0 V or another forward voltage at which a reduction reaction of the transparent electrode layer 104 does not occur, as shown in FIGS. 2A, 2B, 2C and 2D, is applied a plural number of times in a pulsating manner from the power supply 109 for voltage application through the substrate 101 used as a cathode and the counter electrode 106 used as an anode, while the voltage gradient when the forward voltage is caused to drop is controlled to −15 V/s to −0.1 V/s, whereby, as shown in FIG. 3, a potentially defective portion (shunt portion) exists in the semiconductor 103 and the substrate 101 and the transparent electrode layer 104 form the short-circuit current path 105, a portion of the transparent electrode layer 104 that is electrically connected to the substrate 101 is selectively removed by the electrolytic treatment while suppressing a large negative current from flowing into the photovoltaic element in the electrolytic treatment, without breaking any weak portion of the photovoltaic element other than the shunt portion and increasing the shunt path by the electrolytic treatment. Incidentally, the voltage gradient when the forward applied voltage is linearly changed from V to 0 is $\Delta V/\Delta t$ ($\Delta V$=0-applied voltage, $\Delta t$ is a voltage drop time). The photovoltaic element is thereafter taken out, sufficiently cleansed with water, and dried at a temperature of preferably 100 to 180° C. in a hot air oven or the like to enable water remaining in the short-circuit current path 105 to be completely removed, thereby providing the photovoltaic element having only the short-circuit current path 105 removed.

The kind of the electrolytic treatment in accordance with the present invention is not particularly limited. However, it may be such that a photovoltaic element is immersed in an electrolytic solution; a forward voltage not less than an open circuit voltage is applied to the photovoltaic element; the voltage applied to the photovoltaic element is caused to drop while being controlled such that the voltage gradient when the applied forward voltage lowers to 0 V or such a forward voltage as to cause no reduction reaction of a transparent electrode layer is within the range from −15 V/s to −0.1 V/s; and this voltage application is repeatedly performed to selectively dissolve by etching and remove a portion of the transparent electrode layer 104 short-circuited to the substrate 101.

Figure 4:
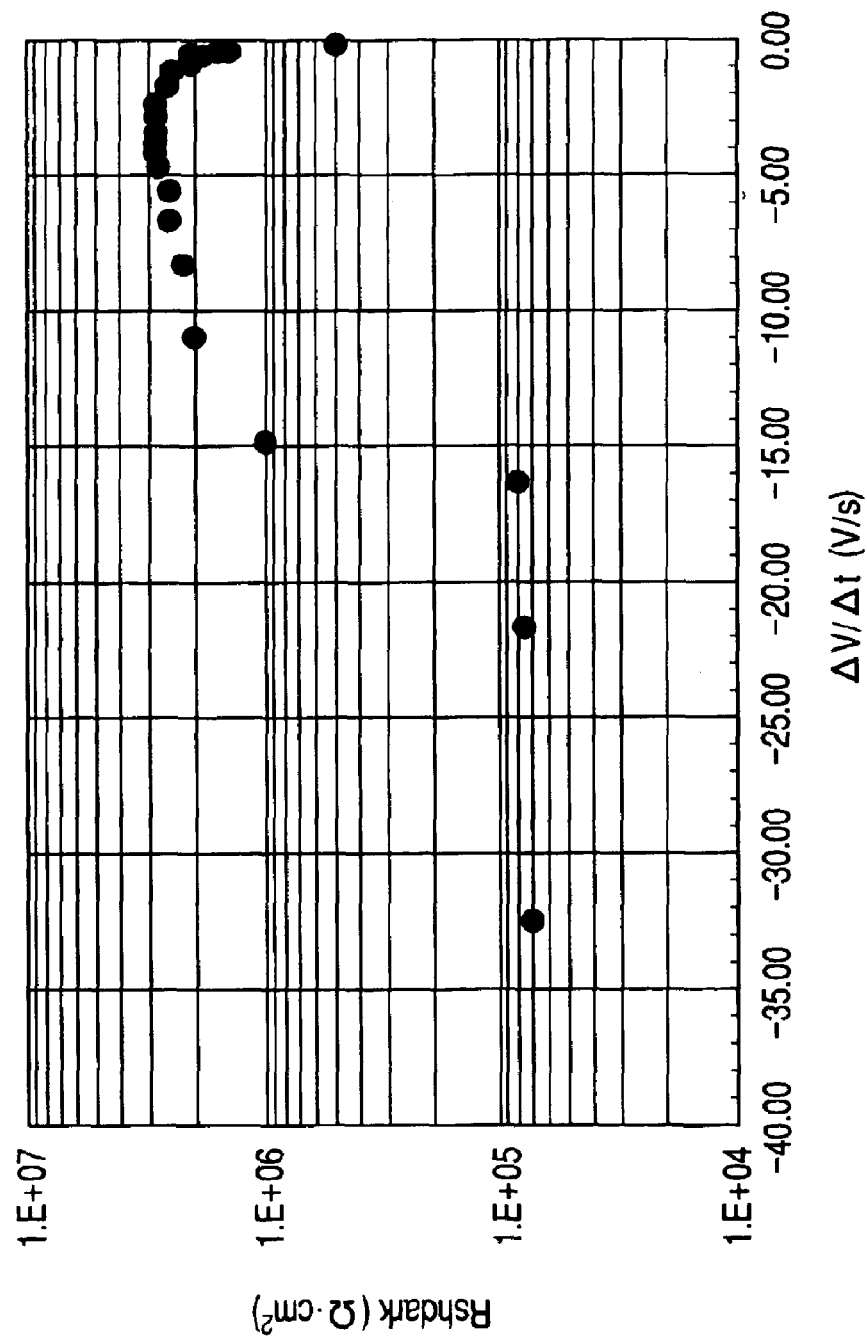
FIG. 4 is a view showing Rshdark vs. voltage gradient dV/dt.

The longer the time period during which the applied forward voltage is caused to drop, the smaller the negative current flowing into the photovoltaic element when the forward voltage drops. FIG. 4 shows shunt resistance (Rshdark) of the photovoltaic element (a stacked double solar cell in this case) in a dark state vs. voltage gradient. The relationship shown in FIG. 4 was obtained in such a manner that the applied forward voltage was fixed at 3.25 V and the voltage gradient was changed by changing the time during which the applied forward voltage dropped. Electrolytic treatment was performed for ten samples with respect to each of different temperature gradient values and the average of Rshdark was determined. It can be seen from FIG. 4 that the Rshdark changes abruptly at the voltage gradient of about −15 V/s as a threshold, and that a high Rshdark can be obtained by controlling the voltage gradient so as to be not less than −15 V/s.

However, if the voltage drop time is unnecessarily long, the time required for the electrolytic treatment becomes considerably long, which is undesirable from the viewpoint of production efficiency. Further, there is a possibility that a portion of the transparent electrode layer 104 at the periphery of the portion short-circuited to the substrate 101 may excessively be dissolved by etching. Therefore, there is a need to suitably select the voltage drop time depending on the applied voltage. Specifically, the voltage drop time is preferably 15 seconds or less, more preferably 5 seconds or less, most preferably 2.5 seconds or less.

Further, there is a need to select the forward voltage applied to the photovoltaic element according to the semiconductor layer construction of the photovoltaic element. In a stacked-type photovoltaic element, it is necessary to increase the forward voltage with the increasing number of stacked layers. Specifically, the applied voltage is preferably 1.5 V or more, more preferably 2 V or more, most preferably 2.5 V or more.

In FIG. 4, a lowering in the shunt resistance is recognized when the voltage gradient value is more than −0.1 V/s, and it can be seen that the voltage gradient is preferably −15 V/s to −0.1 V/s. The voltage gradient is more preferably −15 V/s to −0.5 V/s, and most preferably −15 V/s to −1.0 V/s.

The electrolytic solution 108 is not particularly limited. However, it may be an electrolytic solution of a salt, a Lewis acid, a Lewis base or the like that occurs no precipitation of a metal in an aqueous solution, specifically an aqueous solution of a mixture of sulfuric acid and potassium hydroxide having a pH adjusted to be $0.85 \leq pH \leq 3.0$, an aqueous aluminum sulfate solution having a proportion of the solute relative to the solvent adjusted to 10 to 30 wt. %, or the like.

The electrical conductivity of the electrolytic solution 108 is preferably 20 to 100 mS/cm, most preferably 25 to 70 mS/cm for the purpose of reducing the liquid resistance between the substrate and the counter electrode.

The temperature of the electrolytic solution 108 is preferably 20 to 80° C., and is most preferably 20 to 30° C. from the viewpoint of avoiding complication of the electrolytic treatment apparatus.

As the transparent electrode layer 104 for use in amorphous silicon solar cells, microcrystalline silicon solar cells, etc., $SnO_2$ film, $In_2O_3$ film, ITO ($In_2O_3+SnO_2$) film or the like, excellent in transparency to visible light and in electrical conductivity, is used. It is preferable that if the transparency to visible light is the same, the sheet resistance of the transparent electrode layer is smaller, for the purpose of reducing the series resistance of the solar cell to improve the fill factor in the current-voltage curve of the solar cell and improving the current collection efficiency to reduce the number of grid electrodes thereby reducing the shadow loss due to the shadow of the grids.

As a film forming method for forming the transparent electrode layer 104, any of sputtering, vacuum resistance heating vapor deposition, electron beam vapor deposition, spraying, etc., may be used and selected as needed.

EXAMPLES

The method of producing a photovoltaic element in accordance with the present invention will be described with reference to examples thereof. However, the present invention is not limited to the examples described below.

Example 1

Figure 5:
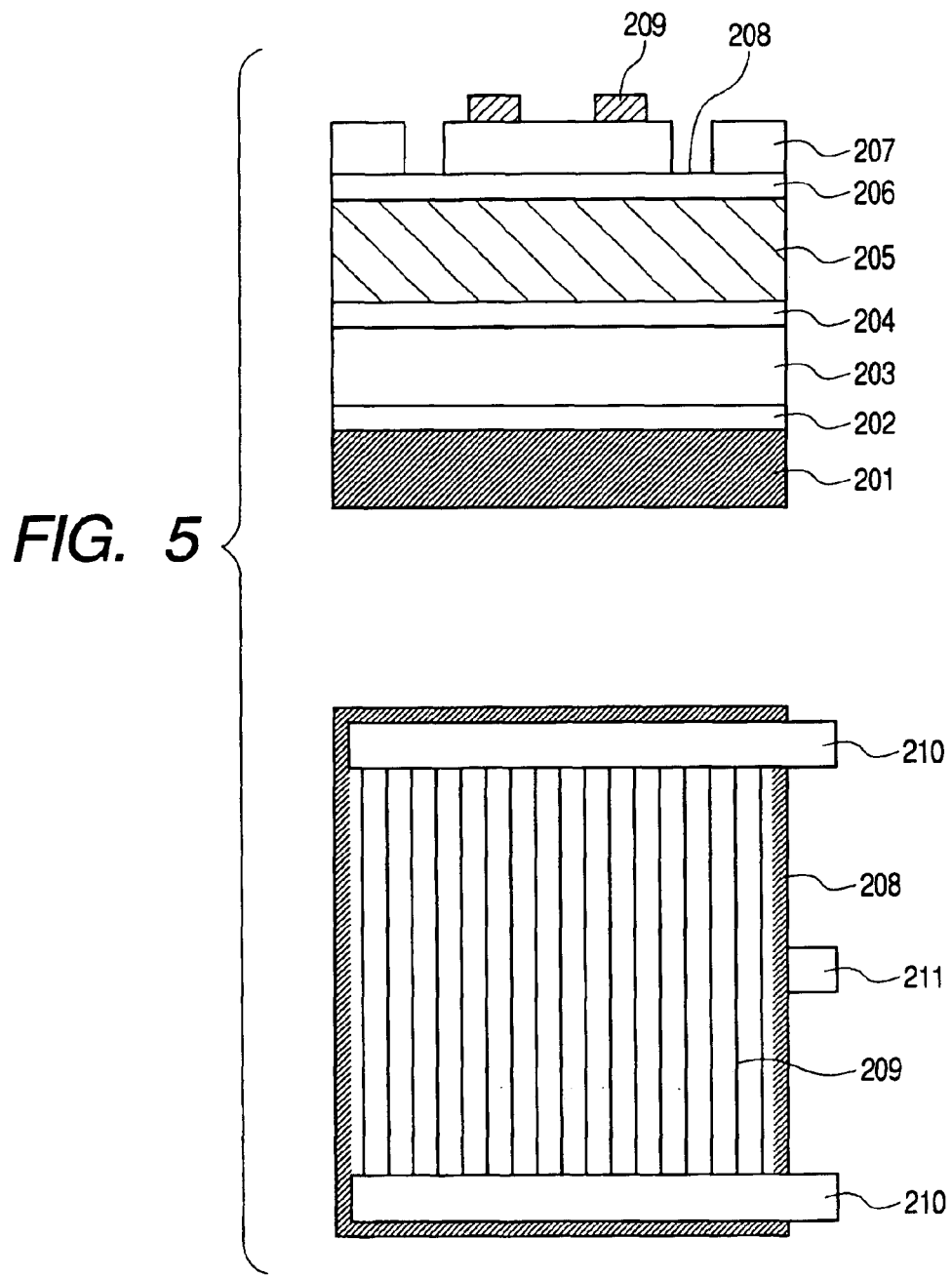
FIG. 5 is a schematic cross-sectional view and a schematic top view of a single solar cell produced in Example 1.

A single solar cell shown in FIG. 5 was produced in this example. FIG. 5 is a cross-sectional view of a single solar cell produced in accordance with the present invention. Referring to FIG. 5, the solar cell has a substrate 201, a back surface reflecting layer 202, a transparent electroconductive layer 203, an n-type semiconductor layer 204 formed of amorphous silicon (hereinafter referred to as a-Si:H), an i-type semiconductor layer 205 formed of microcrystalline silicon (hereinafter referred to as $\mu$c-Si:H), a p-type semiconductor layer 206 formed of $\mu$c-Si:H, a transparent electrode layer 207, an etching patterning line 208, and a current collecting electrode 209.

The process of forming this solar cell will be described in order of steps.

(1) The back surface reflecting layer 202 and the transparent electroconductive layer 203 were formed by batch sputtering method on a 50 mm square stainless steel substrate 201 sufficiently degreased and cleaned. As the material of the layer 202 formed as a metal layer, a simple substance metal such as Ag, Al, Pt, Au, Ni, Ti, Cr, Cu, etc. or an alloy thereof may be used. Ag having a high reflectivity was used in this example. As the material of the layer 203 formed as a transparent electroconductive oxide layer, ZnO, $SnO_2$, $In_2O_3$, ITO or the like may be used, and ZnO was used in this example. The surfaces of these layers are formed in an unevenness (texture) structure for the purpose of causing irregular reflection of light. The film thicknesses of these layers were set to 800 nm and 2000 nm, respectively.

(2) Semiconductor layers 204 to 206 were formed on the transparent electroconductive layer 203 by using a batch-type plasma chemical vapor deposition (CVD) apparatus. As a film forming method for forming the semiconductor layers, any of RF plasma CVD (RFPCVD), VHF plasma CVD (VHFPCVD), microwave plasma CVD (MWPCVD), electron cyclotron resonance (ECR), thermal CVD, etc., may be selected and used as need. The layer 204 was an n-type layer formed of a-Si:H, the layer 205 is an i-type layer formed of $\mu$c-Si:H, and the layer 206 is a p-type layer formed of $\mu$c-Si:H. The n-type layer 204 and the p-type layer 206 were formed by RFPCVD, and the i-type layer 205 was formed by VHFPCVD. Further, the film thickness of the i-type layer 205 was set to 2500 nm.

(3) The ITO film 207 forming a transparent electrode layer was formed on the semiconductor layer 206 by using batch-type vacuum resistance heating vapor deposition. The film thickness was set to 70 nm. The sheet resistance of the ITO at this time was 150 $\Omega/\square$. The process of forming the single cell was thus performed.

(4) On the transparent electrode layer 207 of the above-described cell, an etching paste prepared by kneading fine acrylic resin particles having a particle diameter of 5 $\mu$m and glycerin with an etching solution obtained by heat-melting ferric chloride ($FeCl_3 \cdot 6H_2O$) was printed in lines having a line width of 1 mm in 48 mm square pattern by a screen printing machine. The line thickness was set to 30 $\mu$m. The cell was heated at 170° C. for 5 minutes in an IR oven, taken out of the IR oven, and cooled. The paste was then removed by using pure water and the cell was dried at a temperature of 150° C. for 30 minutes in a hot air oven, thereby forming the 48 mm×48 mm etching pattern 208.

Figure 6A:
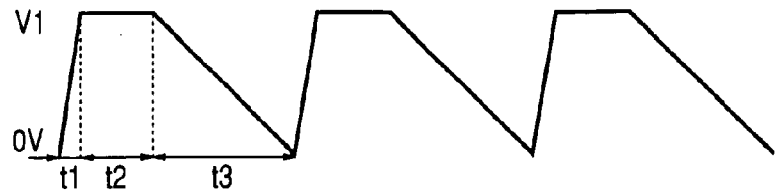
FIGS. 6A, 6B, 6C, 6D and 6E are views showing, applied voltage waveforms used in Examples of the present invention and Comparative Examples.

(5) The cell having the etching pattern 208 formed on the transparent electrode layer 207 was put in an electrolytic solution bath containing an aqueous solution of sulfuric acid and potassium hydroxide (sulfuric acid: 1.0%; potassium hydroxide: 0.7%; and pure water: 98.3%) in which the pH was adjusted to 1.7 and which was maintained at ordinary temperature (25° C.), and an electrolytic treatment was performed by applying a voltage in a waveform shown in FIG. 6A (a trapezoidal wave alternating between a forward voltage and 0 V) through the substrate 201 of the cell used as a cathode and a counter electrode used as an anode, with the interelectrode distance set to 40 mm. The electrolytic treatment was performed by applying the voltage three times in a pulsating manner while setting the forward voltage V1 for this electrolytic treatment to 2.75 V, the forward voltage rising time t1 to 0.1 sec., the forward voltage holding time t2 to 0.35 sec., the forward voltage drop time t3 to 1.2 sec., and the voltage gradient $\Delta V/\Delta t$ (=(0−V1)/t3) when the forward voltage was caused to drop to 0 V to −2.29 V/s, respectively. The electrical conductivity of the sulfuric acid-potassium hydroxide mixture solution was 25.0 mS/cm (25° C.), and the area of the counter electrode was the same as the substrate area (50 mm×50 mm). The negative current that flowed through the cell when the forward voltage for the electrolytic treatment was caused to drop to 0 V was −1.32 mA at the maximum and the corresponding value in terms of current density was −0.053 $mA/cm^2$.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, a low-luminance open circuit voltage (low luminance Voc) when the portion in the etching pattern 208 area of the cell having the etching pattern formed on the transparent electrode layer 207 by the above-described steps (1) to (5) was irradiated with light at an illuminance of 200 lux from a fluorescent lamp was measured and a visual inspection of the appearance of the cell was made. After the measurement of the low-luminance Voc, an electrode formed as the current correcting grid electrode 209 by coating a copper wire with a carbon paste was bonded by a thermal bonding apparatus, an anode 210 using a copper foil and the grid electrode 209 were connected to each other, and a negative electrode 211 was connected by soldering to the back surface of the substrate 201, thereby forming the single solar cell. Thereafter, the voltage-current characteristic was measured in a dark state and the shunt resistance (Rshdark) was obtained from the gradient at the vicinity of the origin. Thereafter, the solar cell characteristics were measured by using a solar simulator with a sunlight spectrum of AM 1.5 at a light quantity of 100 $mW/cm^2$, and the photoelectric conversion efficiency was determined.

As a result, the characteristic at the low luminance Voc was recovered from 0 V before the electrolytic treatment to 0.25 V. While an electrolytic treatment mark of the defect was recognized in the visual appearance inspection, substantially no reduction in the overall film thickness of the transparent electrode layer 207 was recognized and the external appearance was good. Also, the Rshdark was as sufficiently high as $3.0 \times 10^5$ $\Omega \cdot cm^2$, the photoelectric conversion efficiency obtained was 9.2%, and the open circuit voltage at that time was 0.52 V. Thus, the characteristics of the single solar cell on which the electrolytic treatment in accordance with the present invention was performed were good.

Example 2

In this example, a solar cell was produced following the same procedure as in Example 1 with the exception that the electrolytic treatment conditions were different from those in Example 1.

Figure 6B:
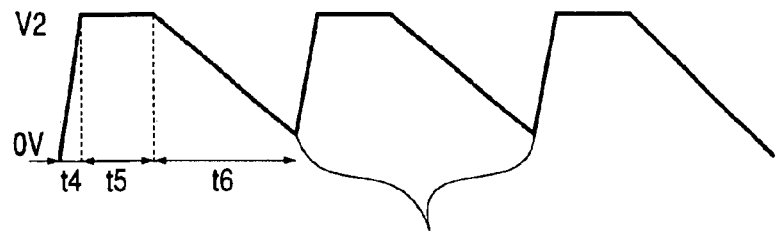

The single cell prepared in the same manner as in Example 1 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6B (a trapezoidal wave alternating between a forward voltage and a forward voltage level of 0.5 V at which reduction reaction on the transparent electrode layer 207 does not occur) through the substrate 201 of the cell used as a cathode and a counter electrode used as an anode, with the interelectrode distance set to 40 mm. The electrolytic treatment was performed by applying the voltage three times in a pulsating manner while setting the forward voltage V2 for this electrolytic treatment to 2.75 V, the forward voltage rising time t4 to 0.1 sec., the forward voltage holding time t5 to 0.3 sec., the forward voltage drop time t6 to 1.2 sec., and the voltage gradient $\Delta V/\Delta t$ (=(0.5−V2)/t6) when the forward voltage was caused to drop to 0.5 V to −1.88 V/s, respectively. The voltage was caused to drop to 0 V only at the time of the third voltage application, thereby completing the electrolytic treatment. The negative current that flowed through the cell when the forward voltage for the electrolytic treatment was caused to drop to 0.5 V was −1.19 mA at the maximum and the corresponding value in terms of current density was −0.048 mA/cm$^2$.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 1 were made and the shunt resistance (Rshdark) in a dark state and the photoelectric conversion efficiency were thereafter determined.

As a result, the characteristic at the low luminance Voc was recovered from 0 V before the electrolytic treatment to 0.25 V. While an electrolytic treatment mark of the defect was recognized in the visual appearance inspection, substantially no reduction in the overall film thickness of the transparent electrode layer 207 was recognized and the external appearance was good. Also, the Rshdark was as sufficiently high as 2.8×10$^5$ Ω·cm$^2$, the photoelectric conversion efficiency obtained was 9.2%, and the open circuit voltage at that time was 0.52 V. Thus, the characteristics of the single solar cell on which the electrolytic treatment in accordance with the present invention was performed were good.

Example 3

In this example, a solar cell was produced following the same procedure as in Example 1 with the exception that the electrolytic treatment conditions were different from those in Example 1 and Example 2.

Figure 6C:

The single cell prepared in the same manner as in Example 1 was put in an electrolytic solution bath containing a 30 wt % aqueous aluminum sulfate solution in which the pH was adjusted to 1.6 and which was maintained at ordinary temperature (25° C.), and an electrolytic treatment was performed by applying a voltage in a waveform shown in FIG. 6C (a sawtooth wave alternating between a forward voltage and 0 V) through the substrate 201 of the cell used as a cathode and a counter electrode used as an anode, with the interelectrode distance set to 40 mm. The electrolytic treatment was performed by applying the voltage five times in a pulsating manner while setting the forward voltage V3 for this electrolytic treatment to 2.50 V, the forward voltage rising time t7 to 0.1 sec., the forward voltage drop time t8 to 1.5 sec., and the voltage gradient ΔV/Δt (=(0−V3)/t8) when the forward voltage was caused to drop to 0 V to −1.67 V/s, respectively. The electrical conductivity of the 30 wt % aqueous aluminum sulfate solution was 33.0 mS/cm (25° C.). The negative current that flowed through the cell when the forward voltage for the electrolytic treatment was caused to drop to 0 V was −0.96 mA at the maximum and the corresponding value in terms of current density was −0.038 mA/cm$^2$.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 1 were made and the shunt resistance (Rshdark) in a dark state and the photoelectric conversion efficiency were thereafter determined.

As a result, the characteristic at the low luminance Voc was recovered from 0 V before the electrolytic treatment to 0.24 V. While an electrolytic treatment mark of the defect was recognized in the visual appearance inspection, substantially no reduction in the overall film thickness of the transparent electrode layer 207 was recognized and the external appearance was good. Also, the Rshdark was as sufficiently high as 2.5×10$^5$ Ω·cm$^2$, the photoelectric conversion efficiency obtained was 9.2%, and the open circuit voltage at that time was 0.52 V. Thus, the characteristics of the single solar cell on which the electrolytic treatment in accordance with the present invention was performed were good.

Example 4

In this example, a solar cell was produced following the same procedure as in Example 1 with the exception that the electrolytic treatment conditions were different from those in Examples 1 to 3.

Figure 6D:
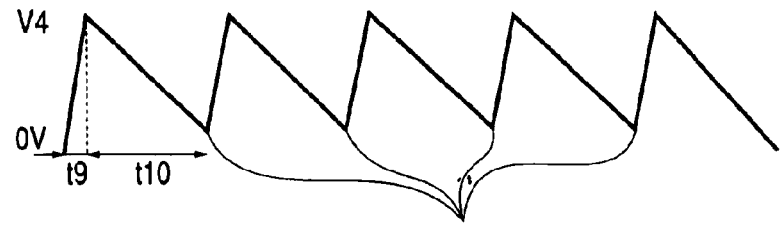

The single cell prepared in the same manner as in Example 1 was put in an electrolytic solution bath containing a 30 wt % aqueous aluminum sulfate solution in which the pH was adjusted to 1.6 and which was maintained at ordinary temperature (25° C.), and an electrolytic treatment was performed by applying a voltage in a waveform shown in FIG. 6D (a sawtooth wave alternating between a forward voltage and a forward voltage level of 0.5 V at which reduction reaction on the transparent electrode layer 207 does not occur) through the substrate 201 of the cell used as a cathode and a counter electrode used as an anode, with the interelectrode distance set to 40 mm. The electrolytic treatment was performed by applying the voltage five times in a pulsating manner while setting the forward voltage V4 for this electrolytic treatment to 2.50 V, the forward voltage rising time t9 to 0.1 sec., the forward voltage drop time t10 to 1.5 sec., and the voltage gradient ΔV/Δt (=(0.5−V4)/t10) when the forward voltage was caused to drop to 0.5 V to −1.33 V/s, respectively. The voltage was caused to drop to 0 V only at the time of the fifth voltage application, thereby completing the electrolytic treatment. The negative current that flowed through the cell when the forward voltage for the electrolytic treatment was caused to drop to 0.5 V was −0.84 mA at the maximum and the corresponding value in terms of current density was −0.034 mA/cm$^2$.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 1 were made and the shunt resistance (Rshdark) in a dark state and the photoelectric conversion efficiency were thereafter determined.

As a result, the characteristic at the low luminance Voc was recovered from 0 V before the electrolytic treatment to 0.24 V. While an electrolytic treatment mark of the defect was recognized in the visual appearance inspection, substantially no reduction in the overall film thickness of the transparent electrode layer 207 was recognized and the external appearance was good. Also, the Rshdark was as sufficiently high as 2.3×10$^5$ Ω·cm$^2$, the photoelectric conversion efficiency obtained was 9.2%, and the open circuit voltage at that time was 0.52 V. Thus, the characteristics of the single solar cell on which the electrolytic treatment in accordance with the present invention was performed were good.

Comparative Example 1

In this example, a solar cell was produced following the same procedure as in Example 1 with the exception that the electrolytic treatment conditions were different from those in Example 1.

Figure 6E:
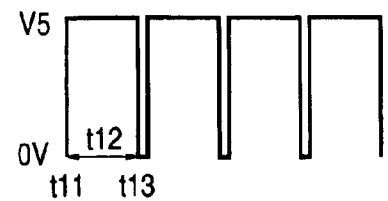

The single cell prepared in the same manner as in Example 1 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6E (a rectangular wave alternating between a forward voltage and 0 V) through the substrate 201 of the cell used as a cathode and a counter electrode used as an anode, with the interelectrode distance set to 40 mm. The electrolytic treatment was performed by applying the voltage four times in a pulsating manner while setting the forward voltage V5 for this electrolytic treatment to 2.75 V, causing the forward voltage to rise and fall in a stepping manner, and setting the forward voltage rising time t11 to 0.01 sec., the forward voltage holding time t12 to 0.35 sec., the forward voltage fall time t13 to 0.01 sec. and the voltage gradient $\Delta V/\Delta t$ (=(0−V5)/t13) when the forward voltage was caused to drop to 0 V to −275 V/s, respectively. The negative current that flowed through the cell when the forward voltage for the electrolytic treatment was caused to drop to 0 V was −13.22 mA at the maximum and the corresponding value in terms of current density was −0.53 mA/cm$^2$. The negative current that flowed through the cell was ten times that in Example 1.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 1 were made and the shunt resistance (Rshdark) in a dark state and the photoelectric conversion efficiency were thereafter determined. The results were shown in Table 1 together with the results in Examples 1 to 4.

As a result, the characteristic at the low luminance Voc was recovered from 0 V before the electrolytic treatment to 0.10 V but the amount of recovery was not sufficient. While an electrolytic treatment mark of the defect was recognized in the visual appearance inspection, substantially no reduction in the overall film thickness of the transparent electrode layer 207 was recognized and the external appearance was good. The Rshdark was 3.5×10$^4$ Ω·cm$^2$, which was lower than those in Examples 1 to 4. Also, the photoelectric conversion efficiency was as low as 8.5%, and the open circuit voltage at that time was 0.48 V, which showed that the characteristics were influenced by shunt.

TABLE 1

| | Appearance | Low luminance Voc (V) | Rshdark (Ω · cm$^2$) | Photoelectric conversion efficiency (%) | Open circuit voltage (V) |
|---|---|---|---|---|---|
| Example 1 | Good | 0.25 | 3.0 × 10$^5$ | 9.2 | 0.52 |
| Example 2 | Good | 0.25 | 2.8 × 10$^5$ | 9.2 | 0.52 |
| Example 3 | Good | 0.24 | 2.5 × 10$^5$ | 9.2 | 0.52 |
| Example 4 | Good | 0.24 | 2.3 × 10$^5$ | 9.2 | 0.52 |
| Comparative Example 1 | Good | 0.10 | 3.5 × 10$^4$ | 8.5 | 0.48 |

It can be seen also from Table 1 that the single solar cells produced by using the electrolytic treatment in accordance with the present invention are solar cells in which existing short-circuit current paths are sufficiently removed and which have a high shunt resistance and other good characteristics.

Example 5

In this example, a solar cell was produced following the same procedure as in Example 1 with the exception that the construction of the semiconductor layers of the solar cell is of a stacked double type, and that the electrolytic treatment conditions were different from those in Example 1.

Figure 7:
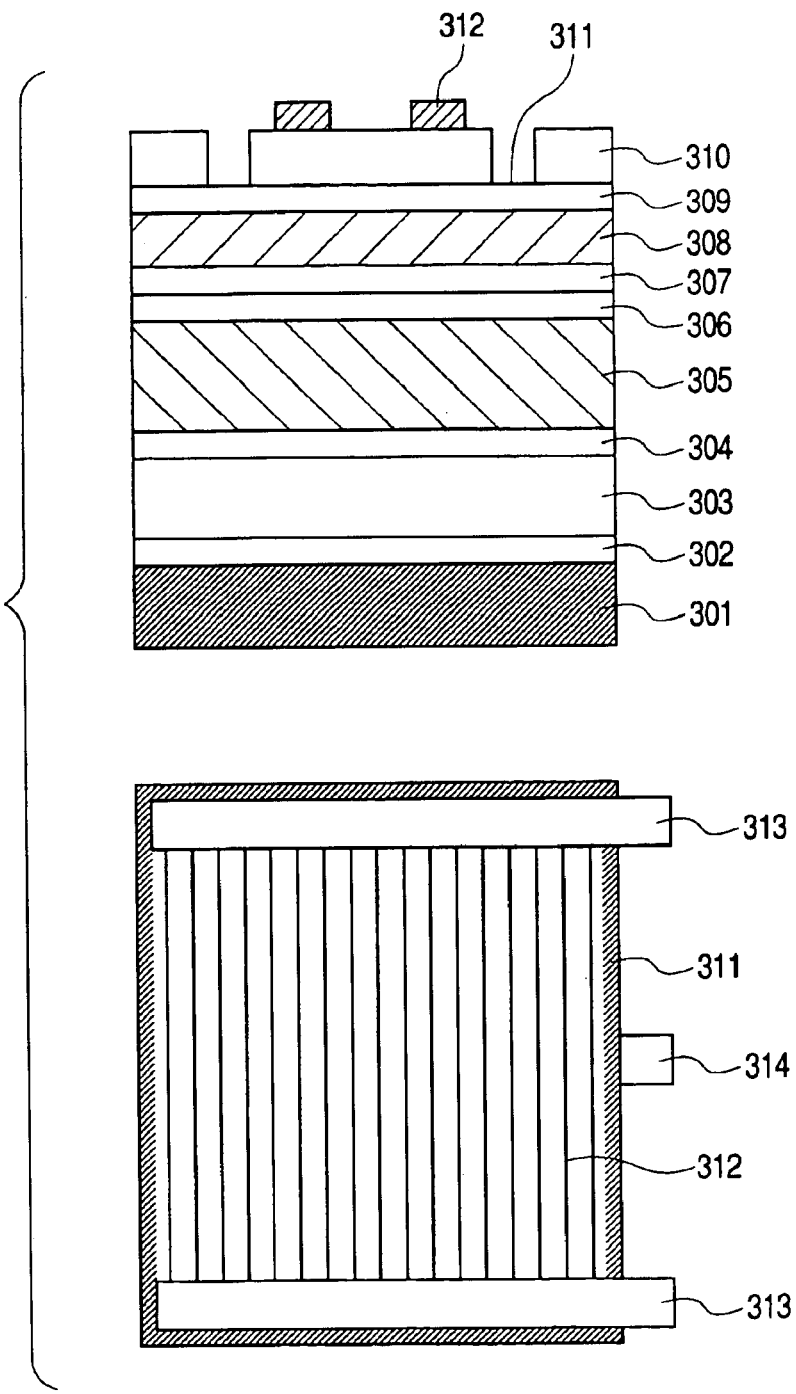
FIG. 7 is a schematic cross-sectional view and a schematic top view of a double solar cell produced in Example 5.

FIG. 7 is a schematic cross-sectional view of the construction of the double solar cell produced in this example. Referring to FIG. 7, Ag is deposited as a back surface reflecting layer 302 on a stainless steel substrate 301, ZnO is deposited as a transparent electroconductive layer 303, and an n-type layer 304 formed of a-Si:H, an i-type layer 305 formed of $\mu$c-Si:H, a p-type layer 306 formed of $\mu$c-Si:H (these layers being provided as a bottom layer), an n-type layer 307 formed of a-Si:H, an i-type layer 308 formed of a-Si:H, and a p-type layer 309 formed of $\mu$c-Si:H (these layers being provided as a top layer) are thereafter stacked one on another as semiconductor layers. That is, the semiconductor layers 304 to 309 are formed as a double cell formed of a-Si:H/$\mu$c-Si:H. The film thickness of the semiconductor layer 305 was set to 2700 nm and the film thickness of the semiconductor layer 308 was set to 350 nm.

On the semiconductor layer 309, an ITO film as a transparent electrode layer 310 having a sheet resistance of 150 Ω/□ was formed. Thereafter, an etching pattern 311 was formed by the same etching treatment as that in Example 1.

Subsequently, the double cell having the etching pattern 311 formed in the transparent electrode layer 310 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6A, which is the same as that in Example 1 (a trapezoidal wave alternating between a forward voltage and 0 V) through the substrate 301 of the cell used as a cathode and a counter electrode used as an anode, with the interelectrode distance set to 40 mm. The electrolytic treatment was performed by applying the voltage three times in a pulsating manner while setting the forward voltage V1 for this electrolytic treatment to 3.25 V, the forward voltage rising time t1 to 0.1 sec., the forward voltage holding time t2 to 0.35 sec., the forward voltage drop time t3 to 1.2 sec., and the voltage gradient $\Delta V/\Delta t$ (=(0−V1)/t3) when the forward voltage was caused to drop to 0 V to −2.71 V/s, respectively. The negative current that flowed through the cell when the forward voltage for the electrolytic treatment was caused to drop to 0 V was −1.56 mA at the maximum and the corresponding value in terms of current density was −0.063 mA/cm$^2$.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 1 were made and the shunt resistance (Rshdark) in a dark state and the photoelectric conversion efficiency were thereafter determined.

As a result, the characteristic at the low luminance Voc was recovered from 0 V before the electrolytic treatment to 0.85 V. While an electrolytic treatment mark of the defect was recognized in the visual appearance inspection, substantially no reduction in the overall film thickness of the transparent electrode layer 310 was recognized and the external appearance was good. Also, the Rshdark was as sufficiently high as 3.0×10$^6$ Ω·cm$^2$, the photoelectric conversion efficiency obtained was 12.0%, and the open circuit voltage at that time was 1.40 V. Thus, the characteristics of the double solar cell on which the electrolytic treatment in accordance with the present invention was performed were good.

Comparative Example 2

In this example, a solar cell was produced following the same procedure as in Example 5 with the exception that the electrolytic treatment conditions were different from those in Example 5.

The double cell prepared in the same manner as in Example 5 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6E, which is the same as that in Comparative Example 1 (a rectangular wave alternating between a forward voltage and 0 V) through the substrate 301 of the cell used as a cathode and a counter electrode used as an anode, with the interelectrode distance set to 40 mm. The electrolytic treatment was performed by applying the voltage four times in a pulsating manner while setting the forward voltage V5 for this electrolytic treatment to 3.25 V, causing the forward voltage to rise and fall in a stepping manner, and setting the forward voltage rising time t11 to 0.01 sec., the forward voltage holding time t12 to 0.35 sec., the forward voltage drop time t13 to 0.01 sec. and the voltage gradient ΔV/Δt (=(0−V5)/t13) when the forward voltage was caused to drop to 0 V to −325 V/s, respectively. The negative current that flowed through the cell when the forward voltage for the electrolytic treatment was caused to drop to 0 V was −15.63 mA at the maximum and the corresponding value in terms of current density was −0.63 mA/cm$^2$. The negative current that flowed through the cell was ten times that in Example 5.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 5 were made and the shunt resistance (Rshdark) in a dark state and the photoelectric conversion efficiency were thereafter determined. The results were shown in Table 2 together with the results in Example 5.

As a result, the characteristic at the low luminance Voc was recovered from 0 V before the electrolytic treatment to 0.48 V but the amount of recovery was not sufficient. While an electrolytic treatment mark of the defect was recognized in the visual appearance inspection, substantially no reduction in the overall film thickness of the transparent electrode layer 310 was recognized and the external appearance was good. The Rshdark was 7.5×10$^4$ Ω·cm$^2$, which was lower than that in Example 5. Also, the photoelectric conversion efficiency was as low as 11.5%, and the open circuit voltage at that time was 1.36 V, which showed that the characteristics were influenced by shunt as is the case with the single solar cell in Comparative Example 1.

TABLE 2

|  | Appearance | Low luminance Voc (V) | Rshdark (Ω · cm$^2$) | Photoelectric conversion efficiency (%) | Open circuit voltage (V) |
| --- | --- | --- | --- | --- | --- |
| Example 5 | Good | 0.85 | 3.0 × 10$^6$ | 12.0 | 1.40 |
| Comparative Example 2 | Good | 0.48 | 7.5 × 10$^4$ | 11.5 | 1.36 |

It can be seen also from Table 2 that the double solar cells produced by using the electrolytic treatment in accordance with the present invention are solar cells in which existing short-circuit current paths are sufficiently removed and which have a high shunt resistance and other good characteristics.

Example 6

In this example, a solar cell was produced following the same procedure as in Example 1 with the exception that the construction of the semiconductor layers of the solar cell is of a stacked triple type, and that the electrolytic treatment conditions were different from those in Example 1.

Figure 8:
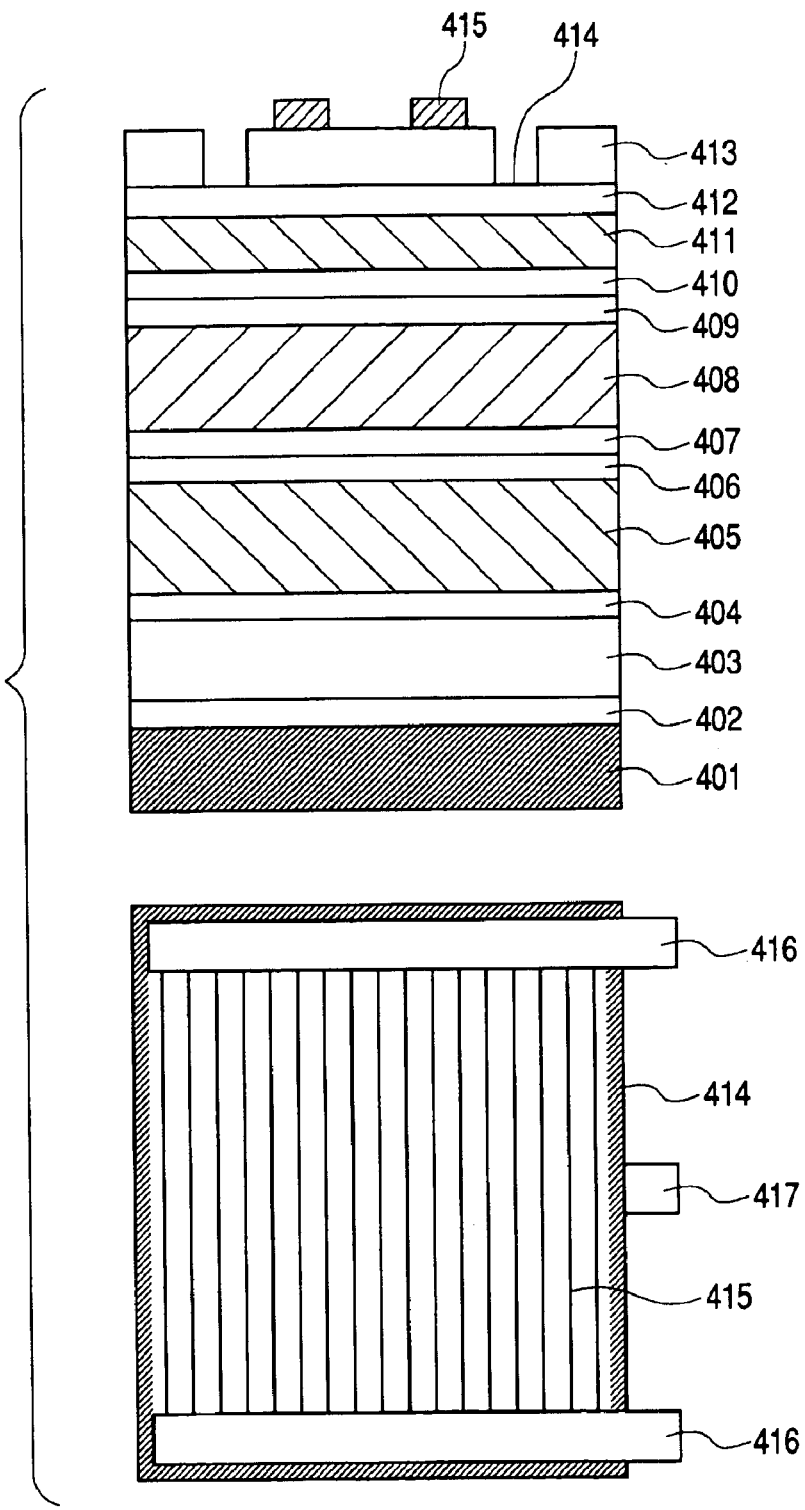
FIG. 8 is a schematic cross-sectional view and a schematic top view of a triple solar cell produced in Example 6.

FIG. 8 is a schematic cross-sectional view of the construction of the triple solar cell produced in this example. Referring to FIG. 8, Ag is deposited as a back surface reflecting layer 402 on a stainless steel substrate 401, ZnO is deposited thereon as a transparent electroconductive layer 403, and an n-type layer 404 formed of a-Si:H, an i-type layer 405 formed of μc-Si:H, a p-type layer 406 formed of μc-Si:H (these layers being provided as a bottom layer), an n-type layer 407 formed of a-Si:H, an i-type layer 408 formed of Hc-Si:H, a p-type layer 409 formed of μc-Si:H (these layers being provided as a middle layer), an n-type layer 410 formed of a-Si:H, an i-type layer 411 formed of a-Si:H, and a p-type layer 412 formed of μc-Si:H (these layers being provided as a top layer) are thereafter stacked one on another as semiconductor layers. That is, the semiconductor layers 404 to 412 are formed as a triple cell formed of a-Si:H/μc-Si:H/μc-Si:H. The film thickness of the semiconductor layer 405 was set to 2700 nm, the film thickness of the semiconductor layer 408 to 2200 nm, and the film thickness of the semiconductor layer 411 to 250 nm.

On the semiconductor layer 412, an ITO film as a transparent electrode layer 413 having a sheet resistance of 150 Ω/□ was formed. Thereafter, an etching pattern 414 was formed by the same etching treatment as that in Example 1.

Subsequently, the triple cell having the etching pattern 414 formed on the transparent electrode layer 413 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6A, which is the same as that in Example 1 (a trapezoidal wave alternating between a forward voltage and 0 V) through the substrate 401 of the cell used as a cathode and a counter electrode used as an anode, with the interelectrode distance set to 40 mm. The electrolytic treatment was performed by applying the voltage three times in a pulsating manner while setting the forward voltage V1 for this electrolytic treatment to 3.75 V, the forward voltage rising time t1 to 0.1 sec., the forward voltage holding time t2 to 0.35 sec., the forward voltage drop time t3 to 1.2 sec., and the voltage gradient $\Delta V/\Delta t$ (=(0−V1)/t3) when the forward voltage was caused to drop to 0 V to −3.13 V/s, respectively. The negative current that flowed through the cell when the forward voltage for the electrolytic treatment was caused to drop to 0 V was −1.80 mA at the maximum and the corresponding value in terms of current density was −0.072 mA/cm$^2$.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 1 were made and the shunt resistance (Rshdark) in a dark state and the photoelectric conversion efficiency were thereafter determined.

As a result, the characteristic at the low luminance Voc was recovered from 0 V before the electrolytic treatment to 1.05 V. While an electrolytic treatment mark of the defect was recognized in the visual appearance inspection, substantially no reduction in the overall film thickness of the transparent electrode layer 413 was recognized and the external appearance was good. Also, the Rshdark was as sufficiently high as $4.0 \times 10^6$ $\Omega \cdot cm^2$, the photoelectric conversion efficiency obtained was 12.6%, and the open circuit voltage at that time was 1.85 V. Thus, the characteristics of the triple solar cell on which the electrolytic treatment in accordance with the present invention was performed were good.

Comparative Example 3

In this example, a solar cell was produced following the same procedure as in Example 6 with the exception that the electrolytic treatment conditions were different from those in Example 6.

The triple cell prepared in the same manner as in Example 6 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6E, which is the same as that in Comparative Example 1 (a rectangular wave alternating between a forward voltage and 0 V) through the substrate 401 of the cell used as a cathode and a counter electrode used as an anode, with the interelectrode distance set to 40 mm. The electrolytic treatment was performed by applying the voltage four times in a pulsating manner while setting the forward voltage V5 for this electrolytic treatment to 3.75 V, causing the forward voltage to rise and fall in a stepping manner, and setting the forward voltage rising time t11 to 0.01 sec., the forward voltage holding time t12 to 0.35 sec., the forward voltage fall time t13 to 0.01 sec. and the voltage gradient $\Delta V/\Delta t$ (=(0−V5)/t13) when the forward voltage was caused to drop to 0 V to −375 V/s, respectively. The negative current that flowed through the cell when the forward voltage for the electrolytic treatment was caused to drop to 0 V was −18.03 mA at the maximum and the corresponding value in terms of current density was −0.72 mA/cm$^2$. The negative current that flowed through the cell was ten times that in Example 6.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Subsequently, the same measurement of low-luminance Voc and the same visual appearance inspection as those in Example 6 were made and the shunt resistance (Rshdark) in a dark state and the photoelectric conversion efficiency were thereafter determined. The results were shown in Table 3 together with the results in Example 6.

As a result, the characteristic at the low luminance Voc was recovered from 0 V before the electrolytic treatment to 0.55 V but the amount of recovery was not sufficient. While an electrolytic treatment mark of the defect was recognized in the visual appearance inspection, substantially no reduction in the overall film thickness of the transparent electrode layer 413 was recognized and the external appearance was good. The Rshdark was $8.0 \times 10^4$ $\Omega \cdot cm^2$, which was lower than that in Example 6. Also, the photoelectric conversion efficiency was as low as 11.9%, and the open circuit voltage at that time was 1.80 V, which showed that the characteristics were influenced by shunt as is the case with the single solar cell in Comparative Example 1 and the double solar cell in Comparative Example 2.

TABLE 3

| | Appearance | Low luminance Voc (V) | Rshdark ($\Omega \cdot cm^2$) | Photoelectric conversion efficiency (%) | Open circuit voltage (V) |
|---|---|---|---|---|---|
| Example 6 | Good | 1.05 | $4.0 \times 10^6$ | 12.6 | 1.85 |
| Comparative Example 3 | Good | 0.55 | $8.0 \times 10^4$ | 11.9 | 1.80 |

It can be seen also from Table 3 that the triple solar cells produced by using the electrolytic treatment in accordance with the present invention are solar cells in which existing short-circuit current paths are sufficiently removed and which have a high shunt resistance and other good characteristics.

Example 7

In this example, a double solar cell with the structure shown in FIG. 7 was produced on a large-area stainless steel substrate in the form of a belt (356.0 mm in width; 100 m in length) by using the roll-to-roll type plasma CVD process.

The process of forming this solar cell will be described in order of steps.

(1) A stainless steel substrate in the form of a belt (356.0 mm in width; 100 m in length) 301 sufficiently degreased and cleansed with Okaite and pure water was placed in a roll-to-roll type DC magnetron sputtering apparatus (not shown), Ag was deposited in a thickness of 800 nm on the substrate and ZnO was thereafter deposited in a thickness of 2000 nm, thereby forming the back surface reflecting layer 302 and the transparent electroconductive layer 303.

(2) The substrate was taken out and was placed in a roll-to-roll type plasma CVD apparatus (not shown) in which deposition chambers with discharge furnaces for respectively depositing the plurality of semiconductor layers were connected via gas gates, and an n-type layer 304 formed of a-Si:H, an i-type layer 305 formed of μc-Si:H, a p-type layer 306 formed of μc-Si:H (these layers being provided as a bottom layer), an n-type layer 307 formed of a-Si:H, an i-type layer 308 formed of a-Si:H and a p-type layer 309 formed of μc-Si:H (these layers being provided as a top layer) were stacked successively on the transparent electroconductive layer 303, thereby forming the double cell formed of a-Si:H/μc-Si:H. The film thickness of the semiconductor layer 305 was set to 1500 nm and the film thickness of the semiconductor layer 308 was set to 300 nm.

(3) The substrate was taken out and placed in a roll-to-roll type DC magnetron sputtering apparatus (not shown), and an ITO film having a sheet resistance of 180 Ω/□ was deposited in a thickness of 65 nm on the semiconductor layer 309, thereby forming a transparent electrode layer 310. Thus, formation of a double solar cell formed of a-Si:H/μc-Si:H was completed.

(4) The double solar cell formed of a-Si:H/μc-Si:H on the stainless steel substrate in the form of the belt were successively cut into four hundred pieces of double solar cells so as to each have a size of 356.0 mm×240.0 mm (at intervals of 240.0 mm in the substrate transporting direction without being changed in width from 356.0 mm), and numbers 1 to 400 were printed on the substrate back surfaces. The solar cell having the above-mentioned size will be referred to as a slab.

(5) The above-described slab was put in an electrolytic solution bath containing an aqueous solution of sulfuric acid and potassium hydroxide in which the pH was adjusted to 1.2 and which was maintained at ordinary temperature (25° C.) (1.0% sulfuric acid, 0.7% potassium hydroxide, 98.3% pure water), and electrolytic etching was performed by flowing a current of 25 A for 0.5 sec. between the cell substrate used as a cathode and a counter electrode as an anode made of Pt patterned in a 355.0× 239.0 mm square, having an exposed portion in the form a line of 0.5 mm in width, with the interelectrode distance set to 0.7 mm, whereby an etching pattern 311 was formed with the transparent electrode layer 310 removed. The electrical conductivity of the sulfuric acid-potassium hydroxide mixture solution was 25.0 mS/cm (25° C.).

Figure 9A:
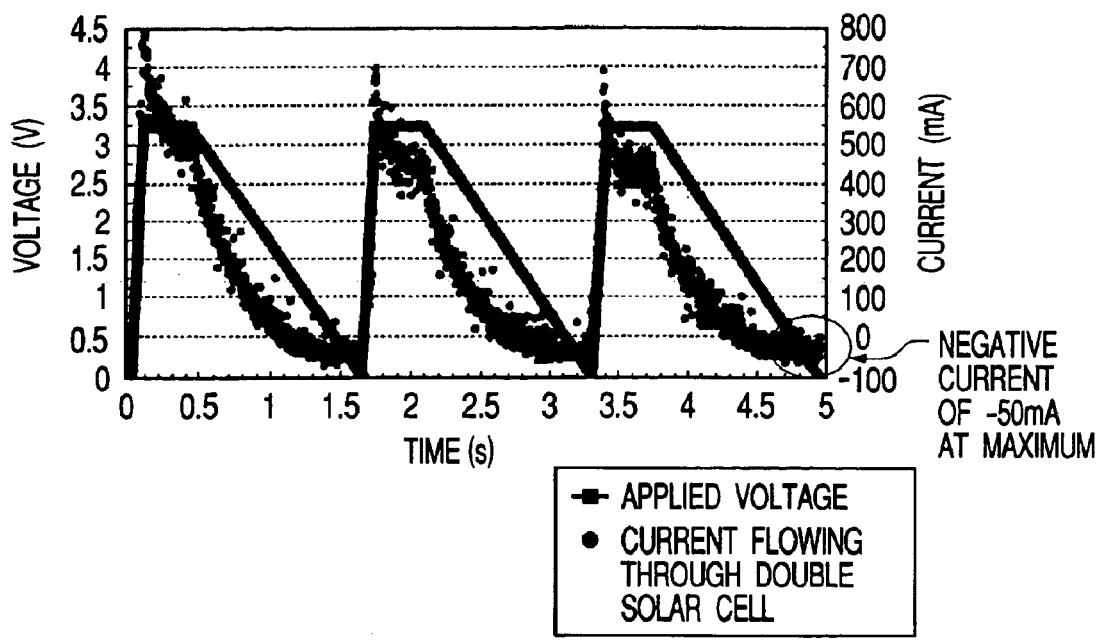
FIG. 9A is a view showing an example of the applied voltage waveform at the time of electrolytic treatment and the waveform of the current flowing through the double solar cell in Example 7 and FIG. 9B is a view showing an example of the applied voltage waveform at the time of electrolytic treatment and the waveform of the current flowing through the double solar cell in Comparative Example 4.

(6) The slab on which the above-described etching pattern 311 was formed was put in an electrolytic solution bath containing the same aqueous solution of sulfuric acid and potassium hydroxide as that used for electrolytic etching, in which the pH was adjusted to 1.2 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6A, which is the same as that in Example 5 (a trapezoidal wave alternating between a forward voltage and 0 V) through the cell substrate used as a cathode and a counter electrode used as an anode, with the interelectrode distance set to 40 mm. The electrolytic treatment was performed by applying the voltage three times in a pulsating manner while setting the forward voltage V1 for this electrolytic treatment to 3.25 V, the forward voltage rising time t1 to 0.1 sec., the forward voltage holding time t2 to 0.35 sec., the forward voltage drop time t3 to 1.2 sec., and the voltage gradient $\Delta V/\Delta t$ ($=(0-V1)/t3$) when the forward voltage was caused to drop to 0 V to $-2.71$ V/s, respectively. The negative current that flowed through the cell when the forward voltage for the electrolytic treatment was caused to drop to 0 V was $-50$ mA at the maximum and the corresponding value in terms of current density was $-0.063$ mA/cm$^2$. The counter electrode area was the same as the substrate area (356.0×240.0 mm). FIG. 9A shows an example of the applied voltage waveform at the time of electrolytic treatment and the waveform of the current flowing through the double solar cell.

The above-described cell was thereafter taken out of the electrolytic solution bath, and the cell surface was sufficiently cleaned of the electrolytic solution with pure water. The cell was thereafter dried at 180° C. for 10 minutes in a hot air oven.

(7) An electrode formed as the current correcting grid electrode 312 by coating a copper wire with a carbon paste was bonded to the above-described electrolytic-treated slab by a thermal bonding apparatus, a positive electrode 313 using a copper foil and the grid electrode 312 were connected to each other, and a negative electrode 314 was connected the back surface of the substrate 301 by laser welding, thus producing the double solar cell. Thereafter, the voltage-current characteristic was measured in a dark state and the shunt resistance (Rshdark) was obtained from the gradient at the vicinity of the origin. Thereafter, the solar cell characteristics were measured by using a solar simulator with a sunlight spectrum of AM 1.5 at a light quantity of 100 mW/cm$^2$, and the photoelectric conversion efficiency was determined.

The steps (5) to (7) and the measurement were successively performed with respect to two hundred slabs (slab Nos. 1 to 200) of the four hundred cut slabs.

Figure 10A:
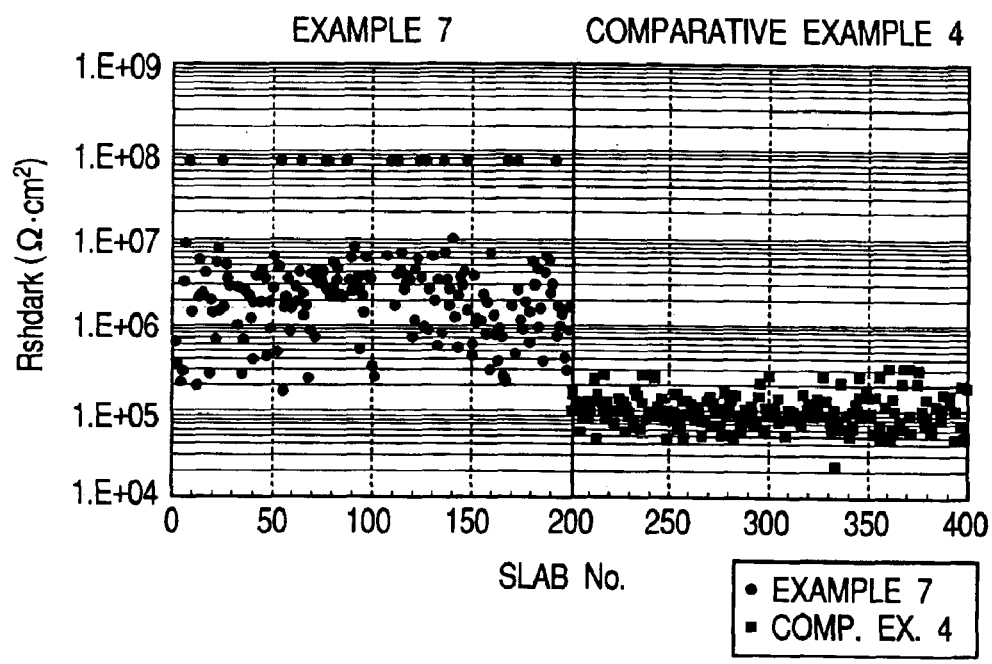
FIGS. 10A and 10B are views showing the Rshdark and the photoelectric conversion efficiency of each slab in Example 7 and Comparative Example 4.
Figure 10B:
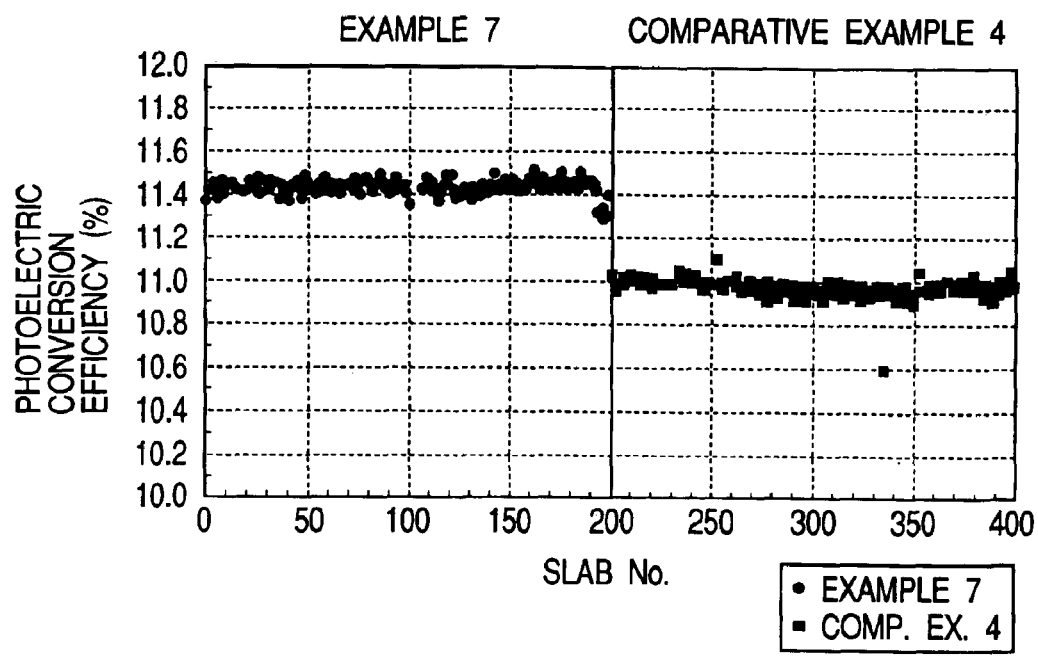

FIG. 10A shows Rshdark of the slabs, and FIG. 10B shows the photoelectric conversion efficiency of the slabs. As a result, the Rshdark of the two hundred slabs is as sufficiently high as $2.0 \times 10^6$ Ω·cm$^2$ on average, and the photoelectric conversion efficiency obtained was 11.4% on average. Thus, the characteristics of the large-area double solar cell on which the electrolytic treatment in accordance with the present invention was performed were good.

Comparative Example 4

In this example, a solar cell was produced using each of the two hundred slabs (slab Nos. 201 to 400) that remained in Example 7 by changing only the electrolytic treatment conditions from Example 7.

Figure 9B:
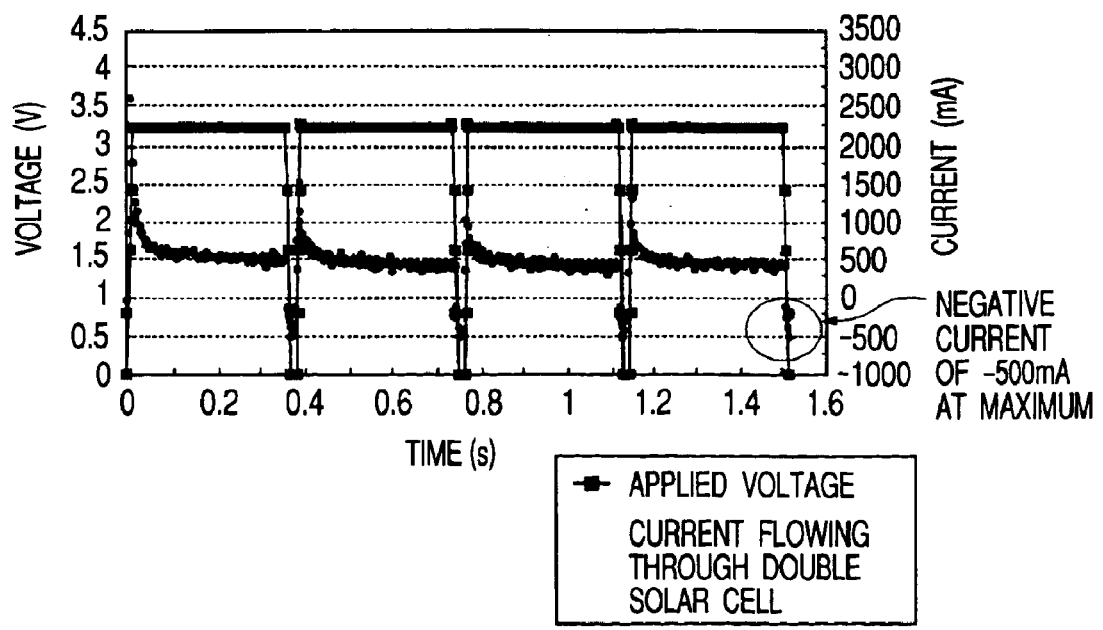

The double cell in Example 7 was put in an electrolytic solution bath containing an aqueous solution of sulfuric acid and potassium hydroxide in which the pH was adjusted to 1.7 and which was maintained at ordinary temperature (25° C.) (1.0% sulfuric acid, 0.7% potassium hydroxide, 98.3% pure water), and an electrolytic treatment was performed by applying a voltage in a waveform shown in FIG. 6E, which is the same as that in Comparative Example 2 (a rectangular wave alternating between a forward voltage and 0 V) through the cell substrate 301 used as a cathode and a counter electrode used as an anode, with the interelectrode distance set to 40 mm. The electrolytic treatment was performed by applying the voltage four times in a pulsating manner while setting the forward voltage V5 for this electrolytic treatment to 3.25 V, causing the forward voltage to rise and fall in a stepping manner, and setting the forward voltage rising time t11 to 0.01 sec., the forward voltage holding time t12 to 0.35 sec., the forward voltage fall time t13 to 0.01 sec. and the voltage gradient $\Delta V/\Delta t$ (=(0−V5)/t13) when the forward voltage was caused to drop to 0 V to −325 V/s, respectively. The negative current that flowed through the cell when the forward voltage for the electrolytic-treatment was caused to drop to 0 V was −500 mA at the maximum and the corresponding value in terms of current density was −0.63 mA/cm². The negative current that flowed through the cell was ten times that in Example 7. FIG. 9B shows an example of the applied voltage waveform at the time of electrolytic treatment and the waveform of the current flowing through the double solar cell.

The above-described cell was thereafter taken out of the electrolytic solution bath, and the cell surface was sufficiently cleaned of the electrolytic solution with pure water. The cell was thereafter dried at 150° C. for 30 minutes in a hot air oven.

Thereafter, the shunt resistance (Rshdark) in the same dark state as that in Example 7 and the photoelectric conversion efficiency were determined. The obtained Rshdark of each slab is shown in FIG. 10A along with the results in Example 7, and the obtained photoelectric conversion efficiency of each slab is shown in FIG. 10B along with the results in Example 7. Table 4 also shows the average Rshdark and the average photoelectric conversion efficiency of the two hundred slabs together with the results in Example 7.

As a result, the average Rshdark was $7.0 \times 10^4$ Ω·cm², which was lower than that in Example 7, and the photoelectric conversion efficiency was as low as 10.9%, which showed that the characteristics were influenced by shunt.

TABLE 4

|  | Average Rshdark (Ω · cm²) | Average photoelectric conversion efficiency (%) |
|---|---|---|
| Example 7 | $2.0 \times 10^6$ | 11.4 |
| Comparative Example 4 | $7.0 \times 10^4$ | 10.9 |

It can be seen also from Table 4 that the large-area double solar cells produced by using the electrolytic treatment in accordance with the present invention are solar cells in which existing short-circuit current paths are sufficiently removed and which have a high shunt resistance and other good characteristics.

The method of producing a photovoltaic element in accordance with the present invention ensures that a shunt portion can selectively be removed with reliability without breaking any portion other than the shunt portion in the photovoltaic element and without increasing the shunt path. Consequently, it is possible to provide a photovoltaic element having good characteristics producible in a high yield, more particularly an improved solar cell.

What is claimed is:

1. A method of producing a photovoltaic element comprising the steps of:

immersing in an electrolytic solution a photovoltaic element comprising a back surface reflecting layer, a semiconductor layer and a transparent electrode layer successively stacked on a substrate;

applying a forward voltage to the photovoltaic element to effect an electrolytic treatment to reduce the transparent electrode layer in a short-circuit portion of the photovoltaic element, thereby selectively removing a short-circuit current path in the photovoltaic element due to a defect, wherein a voltage gradient when the forward voltage applied to the photovoltaic element is caused to drop to 0 V or a such forward voltage as to effect no reduction reaction of the transparent electrode layer is −15 V/s to −0.1 V/s.

2. The method of producing a photovoltaic element according to claim 1, wherein the time period during which the forward voltage is caused to drop is 0.3 second or more.

3. The method of producing a photovoltaic element according to claim 1, wherein the forward voltage is not less than the open circuit voltage of the photovoltaic element.

4. The method of producing a photovoltaic element according to claim 1, wherein the applied voltage is in a form of a trapezoidal wave that alternates between the forward voltage not less than the open circuit voltage of the photovoltaic element and 0 V or such a forward voltage as to effect no reduction reaction of the transparent electrode layer.

5. The method of producing a photovoltaic element according to claim 1, wherein the applied voltage is in a form of a sawtooth wave that alternates between the forward voltage not less than the open circuit voltage of the photovoltaic element and 0 V or such a forward voltage as to effect no reduction reaction of the transparent electrode layer does not occur.

6. The method of producing a photovoltaic element according to claim 1, wherein the applied voltage is applied a plural number of times.

7. The method of producing a photovoltaic element according to claim 1, wherein the photovoltaic element is cleaned with water and dried after the electrolytic treatment.

8. The method of producing a photovoltaic element according to claim 1, wherein the electrical conductivity of the electrolytic solution is 20 to 100 mS/cm.

9. The method of producing a photovoltaic element according to claim 1, wherein the temperature of the electrolytic solution is within the temperature range of 20° C. to 80° C.

10. The method of producing a photovoltaic element according to claim 1, wherein the photovoltaic element is a thin-film solar cell.

* * * * *